(12) United States Patent
Hu et al.

(10) Patent No.: US 9,975,766 B2
(45) Date of Patent: May 22, 2018

(54) MEMS-BASED METHOD FOR MANUFACTURING SENSOR

(71) Applicant: CSMC TECHNOLOGIES FAB1 CO., LTD., Wuxi New District (CN)

(72) Inventors: Yonggang Hu, Wuxi New District (CN); Guoping Zhou, Wuxi New District (CN)

(73) Assignee: CSMC TECHNOLOGIES FAB1 CO., LTD., Wuxi New District, Jiangsu (CN)

( * ) Notice: Subject to any disclaimer, the term of this patent is extended or adjusted under 35 U.S.C. 154(b) by 0 days. days.

(21) Appl. No.: 15/312,146

(22) PCT Filed: May 5, 2015

(86) PCT No.: PCT/CN2015/078245
§ 371 (c)(1),
(2) Date: Nov. 17, 2016

(87) PCT Pub. No.: WO2015/180555
PCT Pub. Date: Dec. 3, 2015

(65) Prior Publication Data
US 2017/0073224 A1    Mar. 16, 2017

(30) Foreign Application Priority Data

May 28, 2014   (CN) .......................... 2014 1 0231976

(51) Int. Cl.
*B81C 1/00*    (2006.01)
(52) U.S. Cl.
CPC ............ *B81C 1/00619* (2013.01); *B81C 1/00* (2013.01); *B81C 2201/0133* (2013.01); *B81C 2201/0142* (2013.01)
(58) Field of Classification Search
CPC .... B81C 2201/0133; B81C 2201/0142; B81C 1/00619
See application file for complete search history.

(56) References Cited

U.S. PATENT DOCUMENTS 7,998,776 B1    8/2011   Li et al.
2001/0033670 A1   10/2001  Tai et al.
(Continued)

FOREIGN PATENT DOCUMENTS

CN      101066749 A    11/2007
CN      102190284 A    9/2011
(Continued)

OTHER PUBLICATIONS

Office Action and English Translation thereof for Japanese Application No. 2017-500124, dated Sep. 5, 2017 (9 pages).
(Continued)

*Primary Examiner* — Mamadou Diallo
(74) *Attorney, Agent, or Firm* — Kagan Binder, PLLC

(57) ABSTRACT

An MEMS-based method for manufacturing a sensor comprises the steps of: forming a shallow channel (120) and a support beam (140) on a front surface of a substrate (100); forming a first epitaxial layer (200) on the front surface of the substrate (100) to seal the shallow channel (120); forming a suspended mesh structure (160) below the first epitaxial layer (200); and forming a deep channel (180) at a position on a back surface of the substrate (100) corresponding to the shallow channel (120), so that the shallow channel (120) is in communication with the deep channel (180). In the Method of manufacturing a MEMS-based sensor, when a shallow channel is formed on a front surface, a support beam of a mass block is formed, so the etching of a channel is easier to control, the process is more precise, and the uniformity and the homogeneity of the formed support beam are better.

10 Claims, 5 Drawing Sheets

(56) References Cited

U.S. PATENT DOCUMENTS

| | | | | |
|---|---|---|---|---|
| 2009/0325335 A1* | 12/2009 | Perruchot | ............ | B81C 1/00595 438/50 |
| 2014/0054730 A1* | 2/2014 | Graham | ................ | B81B 3/0021 257/415 |
| 2014/0057382 A1* | 2/2014 | Supino | ................ | B81C 1/00619 438/50 |
| 2014/0374885 A1* | 12/2014 | Chang | ..................... | H01L 29/06 257/622 |
| 2015/0246809 A1* | 9/2015 | Brockmeier | .......... | B81C 1/0015 257/417 |

FOREIGN PATENT DOCUMENTS

| | | |
|---|---|---|
| DE | 102007002273 A1 | 7/2008 |
| JP | 2003251598 A | 9/2003 |
| JP | 2007227875 A | 9/2007 |
| JP | 2009-516597 A | 4/2009 |
| JP | 2011-091353 A | 5/2011 |
| JP | 2014-086467 A | 5/2014 |
| WO | 2010060684 A2 | 6/2010 |

OTHER PUBLICATIONS

English Translation of International Search Report for International Application No. PCT/CN2015/078245, dated Aug. 7, 2015.

Deng et al., U.S. Appl. No. 14/902,516, International Application dated Jul. 29, 2014.

Zhong et al., U.S. Appl. No. 14/902,517, International Application dated Jul. 22, 2014.

Zhang et al., U.S. Appl. No. 14/902,519, International Application dated Aug. 19, 2014.

Wang et al., U.S. Appl. No. 14/902,302, International Application dated Sep. 2, 2014.

Zhang et al., U.S. Appl. No. 15/023,049, International Application dated Dec. 2, 2014.

Jing et al., U.S. Appl. No. 15/023,057, International Application dated Dec. 4, 2014.

Hu et al., U.S. Appl. No. 15/119,249, International Application dated May 8, 2015.

Wang et al., U.S. Appl. No. 15/119,289, International Application dated Apr. 29, 2015.

Qian et al., U.S. Appl. No. 15/119,311, International Application dated May 6, 2015.

Zhang et al., U.S. Appl. No. 15/308,574, International Application dated May 4, 2015.

Rao et al., U.S. Appl. No. 15/309,744, International Application dated Jul. 10, 2014.

Extended European Search Report for counterpart European Application No. 15800029.9, dated Nov. 30, 2017 (6 pages).

* cited by examiner

MEMS-BASED METHOD FOR MANUFACTURING SENSOR

FIELD OF THE INVENTION

The present invention relates to a technical field of semiconductor devices, and more particularly relates to a method of manufacturing a MEMS-based sensor.

BACKGROUND OF THE INVENTION

MEMS (Micro Electro Mechanical Systems) is a miniature integrated system which manufactures a micro-structure, a micro-sensor, a micro-actuator, a control and processing circuit, even an interface, a communicator and a power supply on one or several chips, taking advantage of a manufacturing method for integrated circuit and a micromachining technology. Due to the development of MEMS technology, taking advantage of MEMS technology to manufacture sensors, for example, a pressure sensor is extensively applied in the consuming electronic field. Manufacturing MEMS pressure sensor requires manufacturing a support beam, a support beam structure of a conventional MEMS pressure sensor, which is connected to a mass block, is formed when a deep channel is formed in the back-etching process. The support beam has a height of about 350 μm. In the process of etching a channel, the uniformity and the homogeneity of a width of the support beam is difficult to be controlled, thus resulting in an inconsistency of shedding time of the mass block in subsequent KON etching process, causing the etching time the piezo-resistive diaphragm to be different, and the piezo-resistive diaphragm has an inconsistent thickness, thereby a consistence of the parameter of the pressure sensor device is poor. In order to control and guarantee a uniformity and homogeneity of the support beam structure, the etching process of the deep channel is required to be accurately controlled, thus reducing production efficiency and it is not conductive to reduce a production cost. In the conventional technology, a poor uniformity and a poor homogeneity of the support beam is presented.

SUMMARY

Accordingly, it is necessary to provide a method of manufacturing a MEMS-based sensor which enhances uniformity and homogeneity of the support beam.

A method of manufacturing a MEMS-based sensor includes the following steps:

providing a substrate;

forming a shallow channel and a support beam on a front surface of the substrate;

forming a first epitaxial layer on the front surface of the substrate to seal the shallow channel;

forming a suspended meshed structure beneath the first epitaxial layer;

forming a second epitaxial layer on the first epitaxial layer;

forming a circuit layer on the second epitaxial layer;

forming a deep channel on a position of a back surface of the substrate corresponding to the shallow channel, such that the shallow channel is in communication with the deep channel; and removing the support beam.

In the aforementioned method of manufacturing a MEMS-based sensor, the support beam supporting the mass block is formed at the same time of forming the shallow channel on the front surface. Because the control of the etching of the shallow channel is easier than the control of the etching of the deep channel, and an accuracy of the technology is increased, the uniformity and the homogeneity of the formed support beam improved comparing to the conventional support beam formed when forming a deep channel on the back surface.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Figure 1:
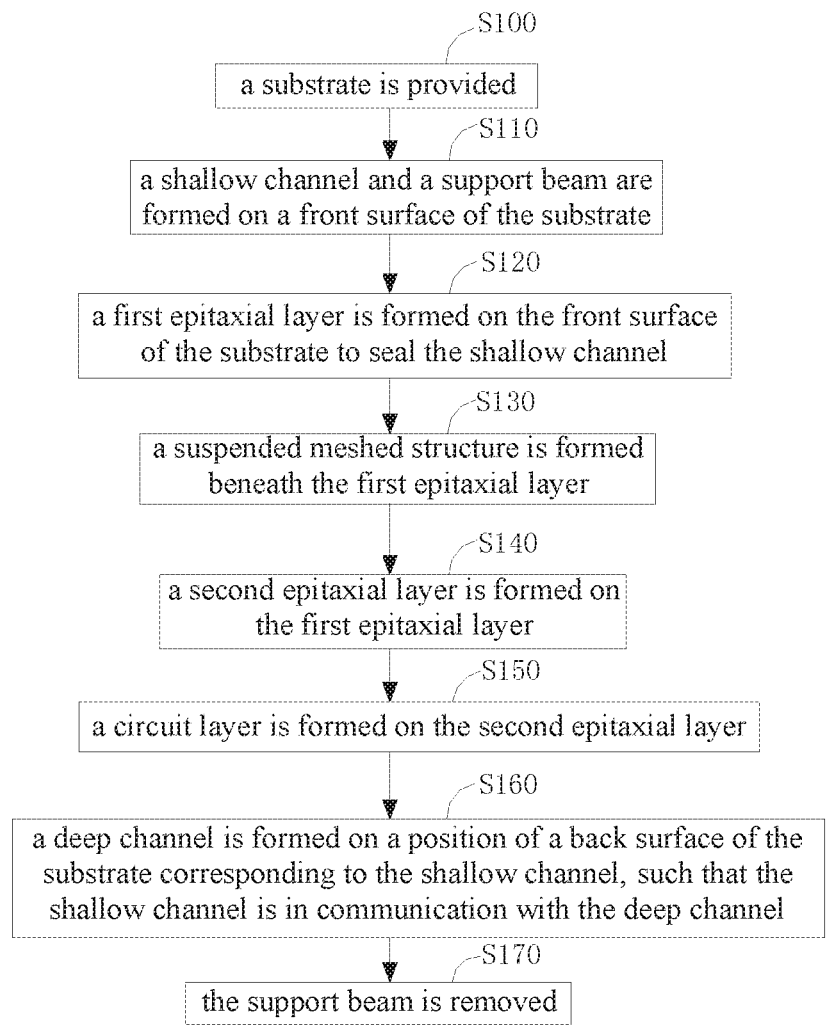
FIG. 1 is a flow chart of a method of manufacturing a MEMS-based sensor.

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The embodiment of the invention will be specifically illustrated with reference to the following description.

FIG. 1 is a flow chart of a method of manufacturing a MEMS-based sensor, referring also to FIG. 2 through FIG. 8. In the embodiment, the method is applied to a pressure sensor.

A method of manufacturing a MEMS pressure sensor includes:

In step S100, a substrate 100 is provided. In the embodiment, the substrate 100 is made of semiconductor material, such as silicon.

Figure 2:
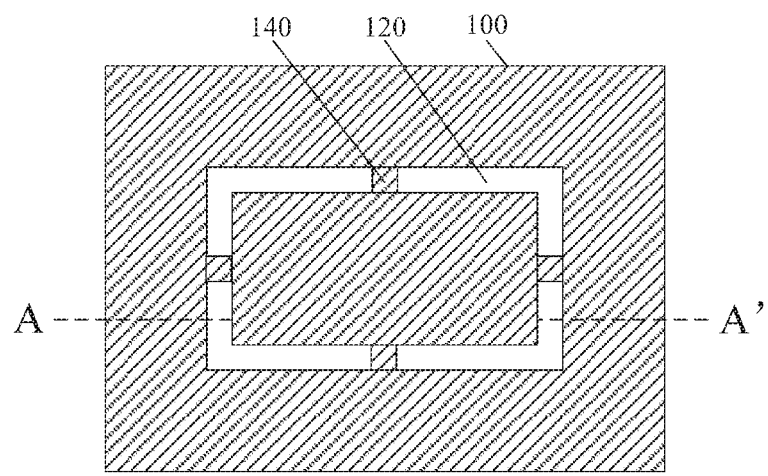
FIG. 2 is a top view of a substrate according to an embodiment.
Figure 3:
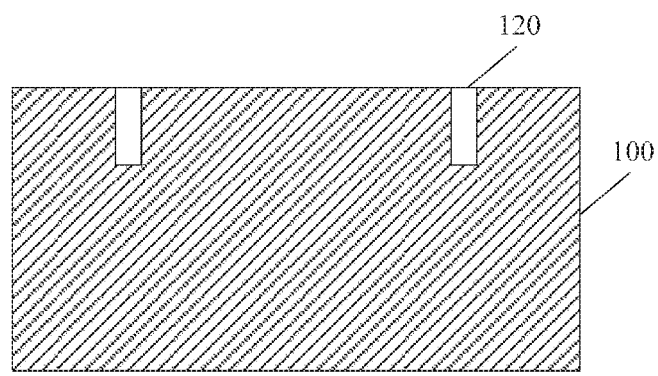
FIG. 3 is a side cross-sectional view taken along line A-A' of FIG. 2.

In step S110, referring to FIG. 2 and FIG. 3, an etching technology is applied to a front surface of the substrate 100 to form four shallow channels 120 with a depth ranging from 50 μm to 100 μm. The four shallow channels 120 are spaced from each other by four support beams 140. The shallow channels 120 divide the top layer of the substrate 100 into inner plates and outer plates. The inner plate is rectangular. Bonding nodes are provided on the four edges of the inner plate between the inner plate and the outer plate. The bonding node is the support beam 140. Preferably, the shallow channel 120 has a depth of 70 μm. In the embodiment, the number of the support beams 140 is four. Apparently, in other embodiments, the number of the support beam 140 is not limited to four, a pair of the edges of the inner plate may be merely provided with a pair of support beams, or provided with the support beams 140 having other number.

Figure 4:
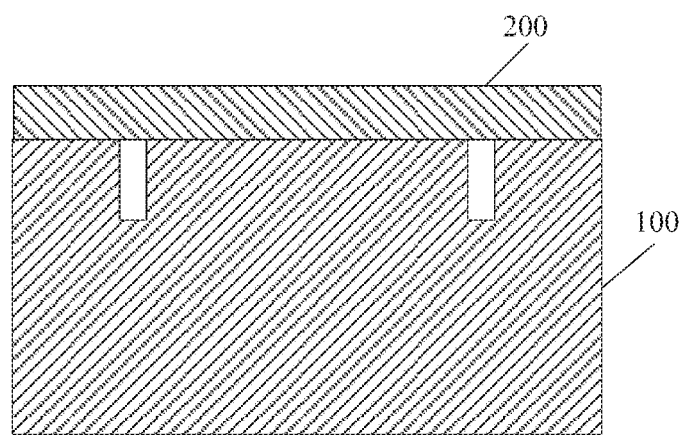
FIG. 4 is a perspective view of a first epitaxial layer according to an embodiment.

In step S120, referring to FIG. 4, a first epitaxial layer 200 with a thickness ranging from 5 μm to 10 μm, is formed on the front surface of the substrate 100 to seal the shallow channels 120. Technologies such as vapor phase epitaxy, liquid phase epitaxy, molecular beam epitaxy or chemical molecular beam epitaxy can be adopted to form the first epitaxial layer 200, or a bonding technology and a thinning technology after the bonding technology can be adopted.

Figure 5:
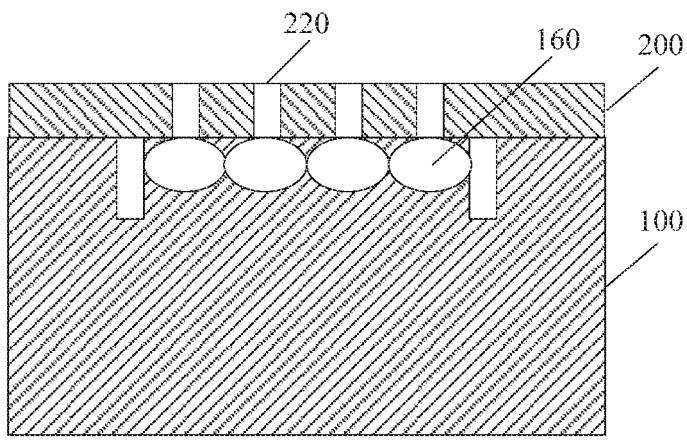
FIG. 5 is a perspective view of a meshed structure according to an embodiment.

In step S130, referring to FIG. 5, a deep hole 220 is formed on the first epitaxial layer 200 by an etching technology, and a suspended meshed structure 160 is formed between the first epitaxial layer 200 and the substrate 100 by an anisotropic technology and an isotropic technology. The meshed structure 160 is in communication with the deep holes 220 and the shallow channels 120, respectively. The meshed structures 160 are mainly presented in the substrate 100 below the first epitaxial layer 200, i.e. in the inner plate of the substrate 100.

Figure 6:
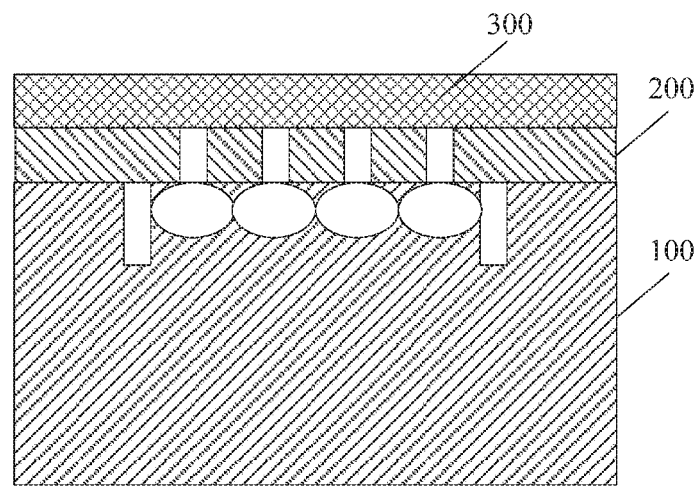
FIG. 6 is a perspective view of a second epitaxial layer according to an embodiment.

In step S140, referring to FIG. 6, a second epitaxial layer 300 (i.e. the piezo-resistive diaphragm) with a depth ranging from 12 μm to 20 μm is formed on the first epitaxial layer 200 to seal the deep hole 220 and the meshed structure 160. Technologies such as vapor phase epitaxy, liquid phase epitaxy, molecular beam epitaxy or chemical molecular beam epitaxy can be adopted to form the second epitaxial layer 300, or a bonding technology and a thinning technology after the bonding technology can be adopted.

Figure 7:
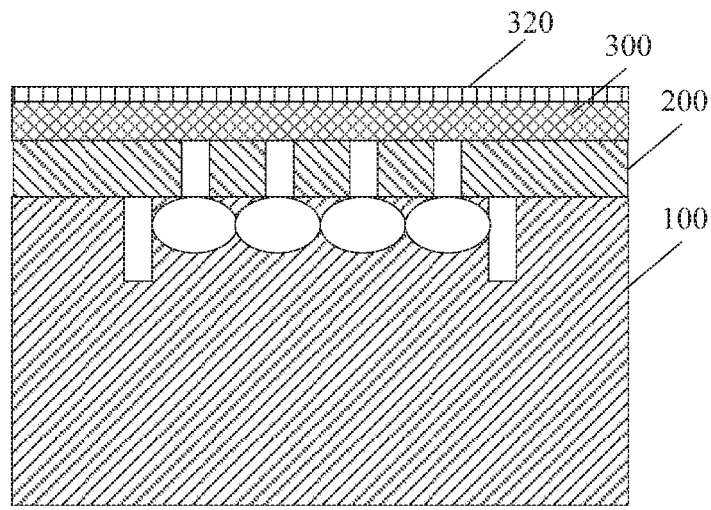
FIG. 7 is a perspective view of a circuit layer according to an embodiment.

In step S150, referring to FIG. 7, a required circuit structure, i.e. a circuit layer 320 is formed on the second epitaxial layer 300 by semiconductor technologies such as photolithography, implantation, diffusion, and etching.

Figure 8:
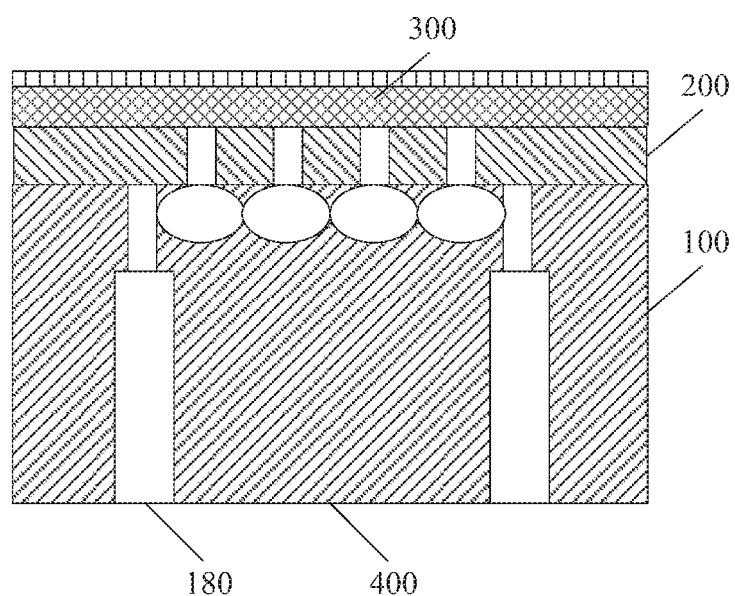
FIG. 8 is a perspective view of a deep channel according to an embodiment.

In step S160, referring to FIG. 8, a deep channel 180 with a depth ranging from 300 μm to 400 μm is formed on a position of a back surface of the substrate 100 corresponding to the shallow channels 120 via photolithography, and etching technologies, and such that the shallow channels 120 are in communication with the deep channel 180. The deep channel 180 divides the lower layer of the substrate 100 into inner plates and outer plates. The inner plate is rectangular, and the inner plate does not have bonding nodes on the four edges to connect the outer plate, thereby enabling the mass block 400 to be connected to the substrate 100 only by the four supporting beams 140 on the shallow channels 120. Preferably, the deep channel 180 has a depth of 350 μm.

In step S170, finally, the circuit layer 320 is coated, and then the supporting beams structure 140 is etched from the back surface of the substrate 100 by the potassium hydroxide solution etching, causing the mass block 400 to fall off, and the second epitaxial layer 300 (piezo-resistive diaphragm) is etched to a required thickness. The control of the etching of the shallow channel 120 is easier than the control of the etching of the deep channel 180, and an accuracy of the technology is higher, the uniformity and the homogeneity of the formed support beam improved comparing to the conventional support beam formed when forming a deep channel 180 on the back surface. Thus, when the potassium hydroxide solution etching is performed, the falling off time of the mass block 400 is the same, such that the uniformity of the thickness of the piezo-resistive diaphragm is better, the homogeneity of the pressure sensor is better, and a parameter thereof is stable. In above method, the manufacturing of the support beam is adopted, an accuracy etching of the shallows 120 is merely required, a technical time and an etching raw material are saved, an equipment utilization rate is efficiently enhanced, a production output is increased and a production cost is reduced.

It can be understood that, although the steps in the flow chart of FIG. 1 shows in a sequence as indicated by arrows, the steps are not necessary to be executed in the sequence as indicated by the arrows. Unless specifically illustrated in the text, there are no strict restrictions to the order for executing these steps, and they can be executed in other orders. Further, at least some of the steps in FIG. 1 can include multiple sub-steps or multiple phases. The sub-steps and the phases are not necessary to be executed simultaneously, and can be executed during different times, and the order is not necessary to be performed one by one, and can be executed alternatively or in a turn with a least a part of the sub-steps of the other step or the other phases.

It can be understood, above method of manufacturing MEMS pressure sensor merely describes some main steps, and does not represent all steps of the method for manufacturing MEMS pressure sensor. The drawings of FIG. 1 through FIG. 8 are exemplary of some main structures of the device in the process of the method of manufacturing MEMS pressure sensor, and do not represent all structures of the device.

The above are several embodiments of the present invention described in detail, and should not be deemed as limitations to the scope of the present invention. It should be noted that variations and improvements will become apparent to those skilled in the art to which the present invention pertains without departing from its spirit and scope. Therefore, the scope of the present invention is defined by the appended claims.

What is claimed is:

1. A method of manufacturing a MEMS-based sensor, comprising the following steps:
   providing a substrate;
   forming a shallow channel and a support beam on a front surface of the substrate;
   forming a first epitaxial layer on the front surface of the substrate to seal the shallow channel;
   forming a suspended meshed structure beneath the first epitaxial layer;
   forming a second epitaxial layer on the first epitaxial layer;
   forming a circuit layer on the second epitaxial layer;

forming a deep channel on a position of a back surface of the substrate corresponding to the shallow channel, such that the shallow channel is in communication with the deep channel; and removing the support beam.

2. The method according to claim 1, wherein the shallow channel and the support beam are formed on the front surface of the substrate by etching technology.

3. The method according to claim 1, wherein the shallow channel has a depth ranging from 50 µm to 100 µm.

4. The method according to claim 1, wherein the first epitaxial layer has a thickness ranging from 5 µm to 10 µm.

5. The method according to claim 1, wherein the second epitaxial layer has a thickness ranging from 12 µm to 20 µm.

6. The method according to claim 1, wherein technologies for forming a circuit layer on the second epitaxial layer comprise photolithography, implantation, diffusion, and etching.

7. The method according to claim 1, wherein the deep channel is formed on the position of the back surface of the substrate corresponding to the shallow channel by etching technology.

8. The method according to claim 1, wherein the deep channel has a depth ranging from 300 µm to 400 µm.

9. The method according to claim 1, wherein the support beam is removed by performing an etching technology to support beam from the back surface of the substrate.

10. The method according to claim 1, wherein a number of the support beams is four.

* * * * *